(12) United States Patent
Kobayashi

(10) Patent No.: US 11,630,010 B2
(45) Date of Patent: Apr. 18, 2023

(54) SEMICONDUCTOR DEVICE

(71) Applicant: SHINKO ELECTRIC INDUSTRIES CO., LTD., Nagano (JP)

(72) Inventor: Tomoki Kobayashi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 377 days.

(21) Appl. No.: 16/875,101

(22) Filed: May 15, 2020

(65) Prior Publication Data

US 2020/0370976 A1 Nov. 26, 2020

(30) Foreign Application Priority Data

May 20, 2019 (JP) .............................. JP2019-094771

(51) Int. Cl.
  *G01L 1/26* (2006.01)
  *H05K 1/14* (2006.01)
  *H05K 1/18* (2006.01)

(52) U.S. Cl.
  CPC ................ *G01L 1/26* (2013.01); *H05K 1/141* (2013.01); *H05K 1/181* (2013.01)

(58) Field of Classification Search
  CPC ........... G01L 1/26; H05K 1/141; H05K 1/181
  See application file for complete search history.

(56) References Cited

U.S. PATENT DOCUMENTS

| 2,745,044 A | * | 5/1956 | Lingel | H01L 25/03 29/520 |
| 2,897,317 A | * | 7/1959 | Hufnagel | H01H 50/56 335/265 |
| 3,665,113 A | * | 5/1972 | Blake | H04M 1/27495 379/357.04 |

(Continued)

FOREIGN PATENT DOCUMENTS

| JP | H02-71278 U | 5/1990 |
| JP | 2004-045378 | 2/2004 |

(Continued)

OTHER PUBLICATIONS

Office Action dated Dec. 6, 2022 with respect to the corresponding Japanese patent application No. 2019-094771.

*Primary Examiner* — Alexander Satanovsky
*Assistant Examiner* — Sharah Zaab
(74) *Attorney, Agent, or Firm* — IPUSA, PLLC

(57) ABSTRACT

A semiconductor device is detachably mountable on a measurement target that includes sensors provided on a predetermined surface thereof. The semiconductor device includes a wiring board having a first surface, and a second surface opposite to the first surface, a semiconductor integrated circuit mounted on the first surface of the wiring board, measuring spring terminals mounted on the second surface of the wiring board, and projections provided on the second surface of the wiring board. Each of the measuring spring terminals makes contact with a terminal connecting to a corresponding one of the sensors to electrically connect the (Continued)

terminal and the corresponding one of the sensors, and each of the projections makes contact with the measurement target, in a state where the semiconductor device is mounted on the measurement target so that the predetermined surface of the measurement target opposes the second surface of the wiring board.

20 Claims, 12 Drawing Sheets

(56) References Cited

U.S. PATENT DOCUMENTS

| | | | | | |
|---|---|---|---|---|---|
| 4,203,642 | A | * | 5/1980 | Minard | H01R 12/88 |
| | | | | | 439/359 |
| 2002/0153983 | A1 | * | 10/2002 | Kaneda | B06B 1/045 |
| | | | | | 335/220 |
| 2006/0220189 | A1 | * | 10/2006 | Sakamoto | G01D 11/245 |
| | | | | | 257/E23.125 |
| 2015/0331016 | A1 | * | 11/2015 | Malhan | G01D 3/10 |
| | | | | | 324/706 |
| 2019/0064219 | A1 | | 2/2019 | Rhee et al. | |

FOREIGN PATENT DOCUMENTS

| | | | | |
|---|---|---|---|---|
| JP | 2005-069402 | | 3/2005 | |
| JP | 2007-188972 | | 7/2007 | |
| JP | 2005069402 | * | 3/2015 | G01L 3/1457 |
| WO | 2009/114948 | | 9/2009 | |

\* cited by examiner

SEMICONDUCTOR DEVICE

CROSS-REFERENCE TO RELATED APPLICATION

This application is based upon and claims priority to Japanese Patent Application No. 2019-094771, filed on May 20, 2019, the entire contents of which are incorporated herein by reference.

FIELD

Certain aspects of the embodiments discussed herein are related to a semiconductor device.

BACKGROUND

There is a known semiconductor device that detects a physical quantity, such as a torque, a displacement, or the like of a measurement target on which the semiconductor device is mounted, based on information obtained from a sensor, such as a strain gauge or the like, that is provided on the measurement target. The electrical connection between the semiconductor device and the sensor is made via connection components, such as lead wires, connectors, or the like, for example. The connection components are connected to terminals that connect to the sensor, by soldering, bonding, or the like, for example.

In general, however, a detection voltage output from the sensor has an extremely small value. For this reason, according to the connection method described above, the detection voltage output from the sensor decreases to an even smaller value due to a wiring resistance of the lead wire up to an input section of the semiconductor device, and a contact resistance of the connection component such as the connector or the like that connects to the semiconductor device. When such a further decrease occurs in the detection voltage output from the sensor, it becomes difficult to accurately obtain the detection voltage from the sensor.

An example of a conventional strain gauge is described in Japanese Laid-Open Patent Publication No. 2005-69402, for example.

SUMMARY

Accordingly, it is an object in one aspect of the embodiments to provide a semiconductor device, that is mounted on a measurement target provided with a sensor, and capable of accurately obtaining a detection voltage from the sensor.

According to one aspect of the embodiments, a semiconductor device, detachably mountable on a measurement target that includes a plurality of sensors provided on a predetermined surface thereof, includes a wiring board having a first surface, and a second surface opposite to the first surface; a semiconductor integrated circuit mounted on the first surface of the wiring board; a plurality of measuring spring terminals mounted on the second surface of the wiring board; and a plurality of projections provided on the second surface of the wiring board, wherein each of the plurality of measuring spring terminals makes contact with a terminal connecting to a corresponding one of the plurality of sensors to electrically connect the terminal and the corresponding one of the plurality of sensors, and each of the plurality of projections makes contact with the measurement target, in a state where the semiconductor device is mounted on the measurement target so that the predetermined surface of the measurement target opposes the second surface of the wiring board.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
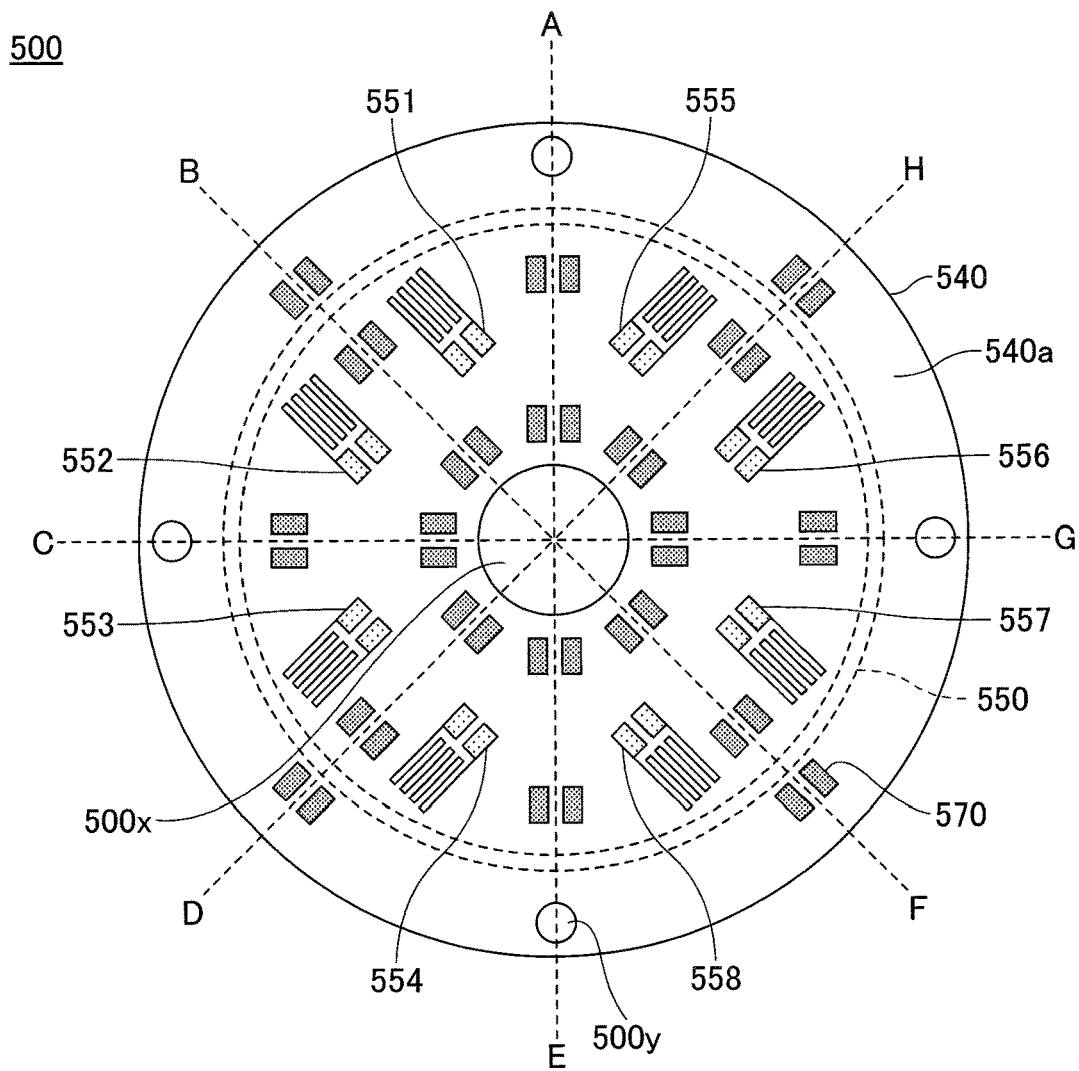
FIG. 1A and FIG. 1B are diagrams illustrating an example of a measurement target of a semiconductor device according to a first embodiment.

Embodiments of the present invention will be described with reference to the accompanying drawings. In the drawings, those parts that are the same are designated by the same reference numerals, and a repeated description of the same parts may be omitted.

A description will now be given of the semiconductor device according to each embodiment of the present invention.

First Embodiment

[Measurement Target]

Figure 1B:
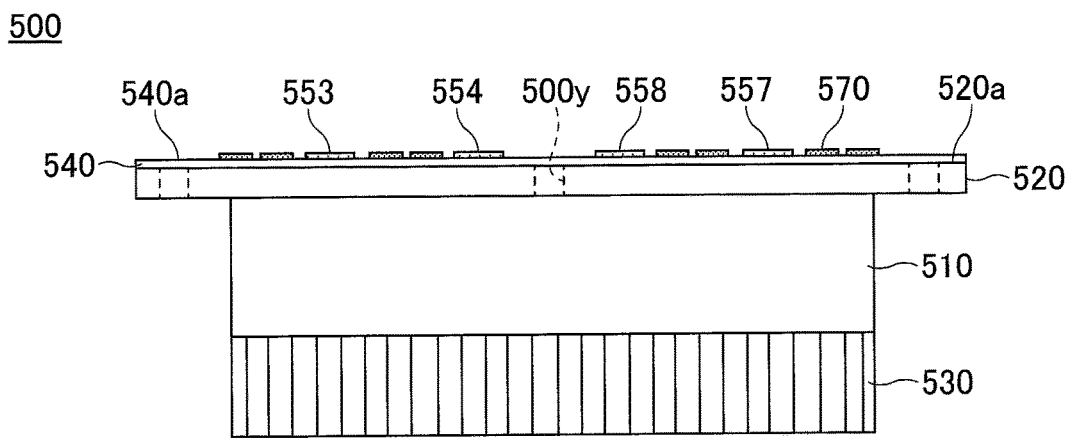

FIG. 1A and FIG. 1B are diagrams illustrating an example of a measurement target of a semiconductor device according to a first embodiment. FIG. 1A is a plan view of the measurement target, and FIG. 1B is a side view of the measurement target.

As illustrated in FIG. 1A and FIG. 1B, a measurement target 500 includes a cylinder section 510, and a disk section 520. The disk section 520 is provided on a first end of the cylinder section 510. A gear 530 is provided circumferentially on a second end of the disk section 520, opposite to the first end of the disk section 520. The disk section 520 as a diameter greater than a diameter of the cylinder section 510. In the plan view, an outer periphery of the disk section 520 forms a projecting region that projects outwards in a ring shape from an outer edge of the cylinder section 510.

A through hole 500x, into which a shaft (not illustrated) may be inserted, is provided at approximate centers of the cylinder section 510 and the disk section 520. 4 through holes 500y are provided in the projecting region at the outer periphery of the disk section 520, at positions point symmetrical with respect to a center of the through hole 500x. The 4 through holes 500y are used to mount a semiconductor device (not illustrated), that measures a strain of the disk section 520, onto the disk section 520 of the measurement target 500.

A flexible substrate famed with a strain gauge, and a flexible substrate formed with dummy terminals, may be prepared separately, and respectively adhered to a predetermined surface 520a of the disk section 520. The number of strain gauges and the number of dummy terminals formed on each flexible substrate, may be determined arbitrarily.

A substrate 540 that is flexible may be adhered to the predetermined surface 520a of the disk section 520. The 540 may be a flexible substrate made of a polyimide resin or the like, for example. Strain gauges 551 through 558 corresponding to 2 channels, and a plurality of dummy terminals 570 are formed on one surface 540a of the substrate 540.

The strain gauges 551 through 558 are sensors having resistances that vary according to a mechanical strain generated in the disk section 520. Each of the strain gauges 551 through 558 includes a pair of terminals for outputting a variation in the resistance. The pair of terminals of each of the strain gauges 551 through 558 are connected to a semiconductor device 1 which will be described later.

In FIG. 1A, 4 straight lines AE, BF, CG, and DH, indicated by dotted lines, denote virtual lines passing the center of the through hole 500x and segmenting the measurement target 500 in the plan view so that 2 mutually adjacent virtual lines form an angle of 45 degrees.

The strain gauges 551 through 558 are arranged at positions point symmetrical with respect to the center of the through hole 500x, for example.

In the example illustrated in FIG. 1A, the strain gauge 551 and the strain gauge 552 having longitudinal directions thereof along the direction of the straight line BF, are arranged so that terminals thereof facing the through hole 500x oppose each other via the straight line BF. In addition, the strain gauge 553 and the strain gauge 554 having longitudinal directions thereof along the direction of the straight line DH, are arranged so that terminals thereof facing the through hole 500x oppose each other via the straight line DH. The strain gauge 551 through 554 are connected to the semiconductor device 1, and form a 1-channel Wheatstone bridge circuit.

Further, the strain gauge 555 and the strain gauge 556 having longitudinal directions thereof along the direction of the straight line DH, are arranged so that terminals thereof facing the through hole 500x oppose each other via the straight line DH. In addition, the strain gauge 557 and the strain gauge 558 having longitudinal directions thereof along the direction of the straight line BF, are arranged so that terminals thereof facing the through hole 500x oppose each other via the straight line BF. The strain gauge 555 through 558 are connected to the semiconductor device 1, and form another 1-channel Wheatstone bridge circuit.

The plurality of dummy terminals 570 are arranged at positions point symmetrical with respect to the center of the through hole 500x, for example.

In the example illustrated in FIG. 1A, 4 pairs of dummy terminals 570 are arranged spaced apart from each other along the straight line AE, where the 2 dummy terminals 570 of each of the 4 pairs of dummy terminals 570 oppose each other via the straight line AE. 6 pairs of dummy terminals 570 are arranged spaced apart from each other along the straight line BF, where the 2 dummy terminals 570 of each of the 6 pairs of dummy terminals 570 oppose each other via the straight line BF. 4 pairs of dummy terminals 570 are arranged spaced apart from each other along the straight line CG, where the 2 dummy terminals 570 of each of the 4 pairs of dummy terminals 570 oppose each other via the straight line CG. 6 pairs of dummy terminals 570 are arranged spaced apart from each other along the straight line DH, where the 2 dummy terminals 570 of each of the 6 pairs of dummy terminals 570 oppose each other via the straight line DH.

The plurality of dummy terminals 570 preferably include dummy terminals 570 arranged on the inner peripheral side of the substrate 540 (that is, closer to the through hole 500x) than the strain gauges 551 through 558, and dummy terminals 570 arranged on the outer peripheral side of the substrate 540 than the strain gauges 551 through 558.

The measurement target 500 may be a strain wave gearing (or harmonic gearing) device, for example. The strain wave gearing device is a reduction gear that is used for rotating or positioning a servo motor or the like with a high accuracy. In this case, because the disk section 520 undergoes resilient deformation, it is possible to detect the physical quantities, such as a pressure, a displacement, an acceleration, a torque, or the like of an output shaft, by mounting the strain gauges 551 through 558 on the disk section 520.

However, the measurement target 500 is not limited to the strain wave gearing device, and may be a driving section or the like of an industrial robot, for example.

[Semiconductor Device]

Figure 2:
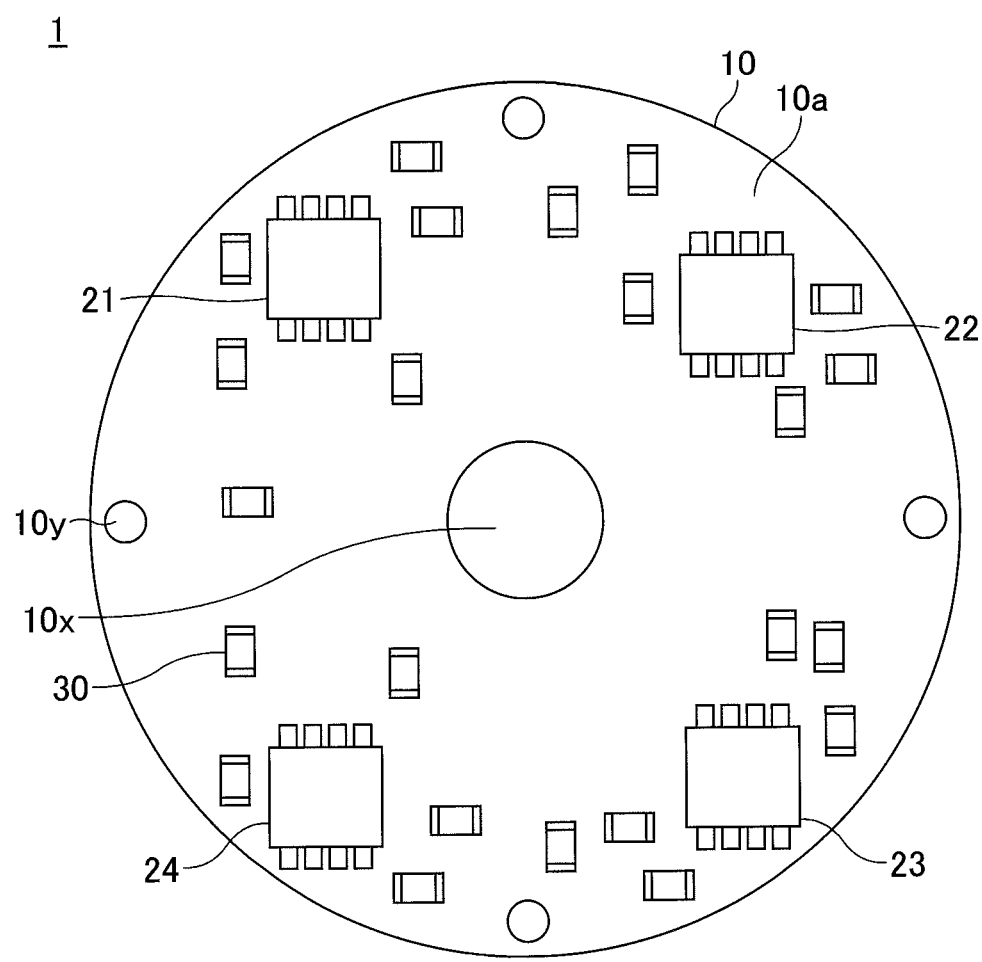
FIG. 2 is a plan view illustrating an example of the semiconductor device according to the first embodiment.
Figure 3:
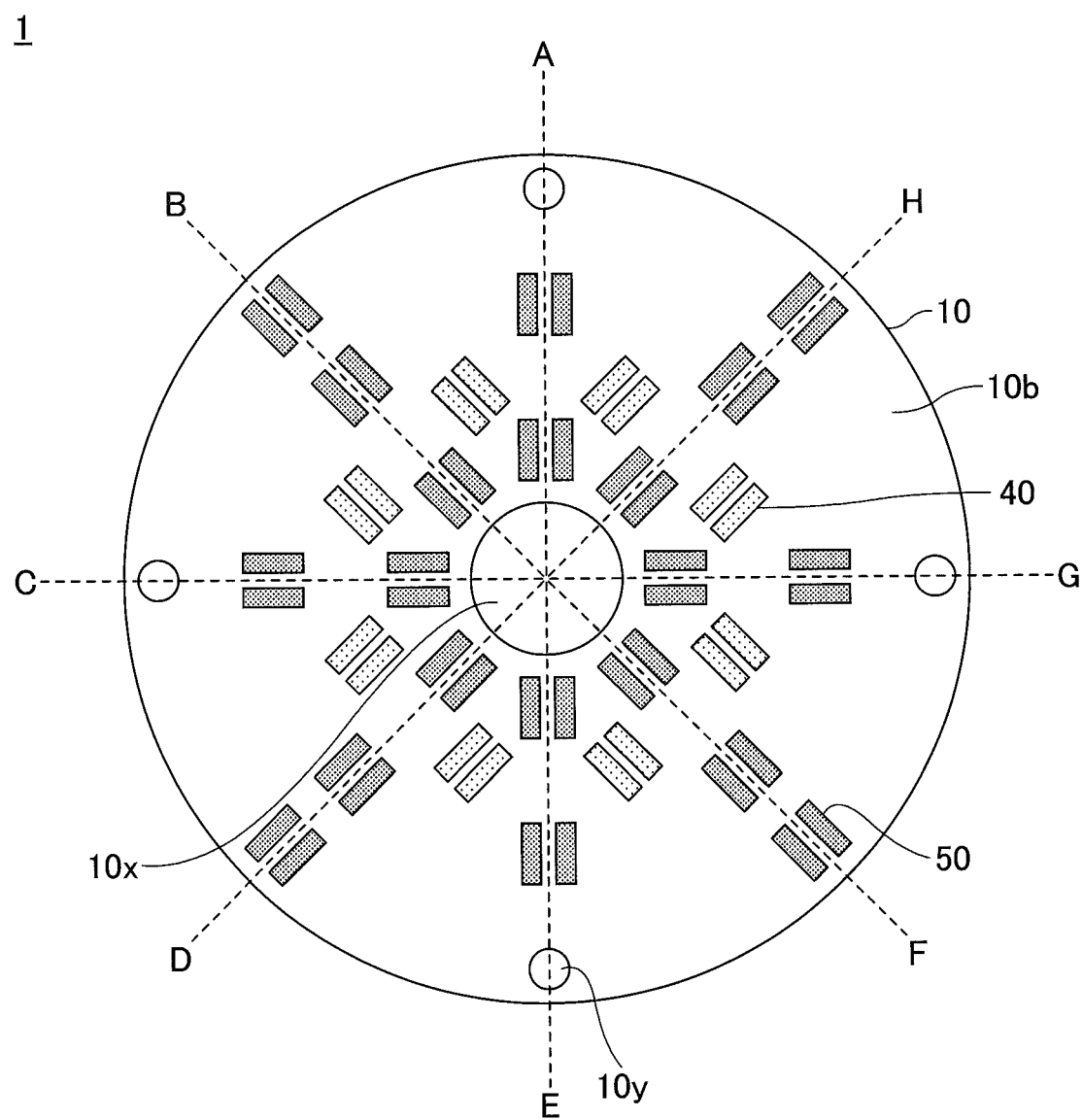
FIG. 3 is a rear view illustrating the example of the semiconductor device according to the first embodiment.

FIG. 2 is a plan view illustrating an example of the semiconductor device according to the first embodiment. FIG. 3 is a rear view illustrating the example of the semiconductor device according to the first embodiment, viewed from an opposite side of the view of FIG. 2.

As illustrated in FIG. 2 and FIG. 3, the semiconductor device 1 includes a wiring board 10, semiconductor integrated circuits 21 through 24, passive components 30, measuring spring terminals 40, and dummy spring terminals 50.

The wiring board 10 is a disk-shaped board having an outer diameter that is approximately the same as the diameter of the disk section 520 of the measurement target 500 illustrated in FIG. 1A and FIG. 1B, for example. A through hole 10x having an inner diameter, that is approximately the same as the inner diameter of the through hole 500x, is provided at an approximate center of the wiring board 10 corresponding to the position of the through hole 500x in the disk section 520. In addition, through holes 10y having an inner diameter, that is approximately the same as the inner diameter of the through holes 500y, are provided at an outer periphery of the wiring board 10 at positions corresponding to the 4 through holes 500y in the disk section 520. The wiring board 10 may be a glass epoxy board, for example, but is not limited to the glass epoxy board.

As illustrated in FIG. 2, the semiconductor integrated circuits 21 through 24, and the plurality of passive components 30, are mounted on a first surface 10a of the wiring board 10. The semiconductor integrated circuits 21 through 24, and the plurality of passive components 30, are mounted on lands provided on the first surface 10a of the wiring board 10, using a solder, for example. However, for the sake of convenience, the illustration of the lands and the solder is omitted in FIG. 2.

The passive component 30 is not particularly limited, and may be a resistor, a capacitor, an inductor, or the like, as appropriate. The mounting positions of the semiconductor integrated circuits 21 through 24 and the passive components 30 are not particularly limited, and the semiconductor integrated circuits 21 through 24 and the passive components 30 may be mounted at arbitrary positions.

As illustrated in FIG. 3, 16 measuring spring terminals 40, and 40 dummy spring terminals 50 formed by projections, are mounted on a second surface 10b of the wiring board 10 opposite to the first surface 10a of the wiring board 10. The measuring spring terminals 40 and the dummy spring terminals 50 are mounted on lands provided on the second surface 10b of the wiring board 10, using a solder, for example. However, for the sake of convenience, the illustration of the lands and the solder is omitted in FIG. 3.

In FIG. 3, for the sake of convenience, the measuring spring terminals 40 are indicated by low-density dot patterns, and the dummy spring terminals 50 are indicated by high-density dot patterns. The number of measuring spring terminals 40 and the number of dummy spring terminals 50 in this example are merely examples, and the number of measuring spring terminals 40 and the number of dummy spring terminals 50 are not limited to those of this example.

Each measuring spring terminal 40 is a connection terminal for electrically connecting the terminal of the corresponding one of the strain gauges 551 through 558 of the measurement target 500 to the semiconductor device 1. Each dummy spring terminal 50 is a terminal for making contact with the corresponding one of the dummy terminals 570 of the measurement target 500. Because the dummy spring terminals 50 and the dummy terminals 570 do not contribute to an electrical operation of the semiconductor device 1, the dummy spring terminal 50 need only make contact with the dummy terminal 570, and the dummy spring terminal 50 and the dummy terminal 570 do not necessarily have to make an electrical connection.

The 4 straight lines AE, BF, CG, and DH indicated by dotted lines in FIG. 3 are the virtual lines located at the positions of the corresponding straight lines AE, BF, CG, and DH illustrated in FIG. 1A.

The plurality of measuring spring terminals 40 are arranged at positions point symmetrical with respect to the center of the through hole 10x, for example, so that each contact portion 48 which will be described later is arranged at a position corresponding to one of the strain gauges 551 through 558. In other words, the positional relationship between the virtual lines and the measuring spring terminals 40 illustrated in FIG. 3, corresponds to the positional relationship between the virtual lines and the strain gauges 551 through 558 illustrated in FIG. 1A.

The plurality of dummy spring terminals 50 are arranged at positions point symmetrical with respect to the center of the through hole 10x, for example, so that each contact portion which will be described later is arranged at a position corresponding to one of the dummy terminals 570. In other words, the positional relationship between the virtual lines and the dummy spring terminals 50 illustrated in FIG. 3, corresponds to the positional relationship between the virtual lines and the dummy terminals 570 illustrated in FIG. 1A.

Figure 4A:
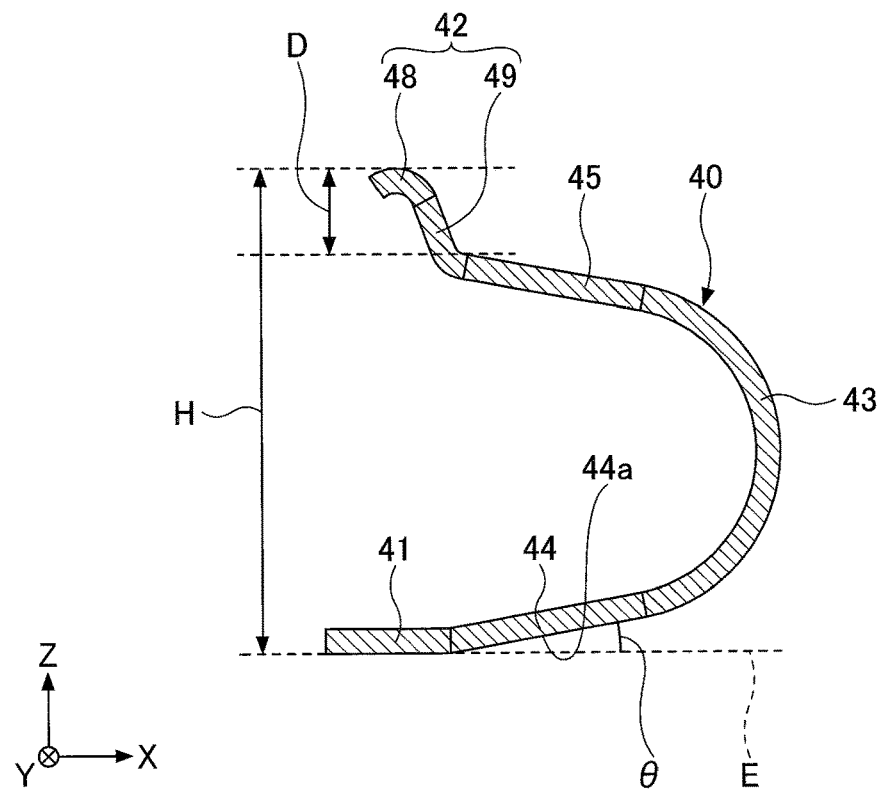
FIG. 4A and FIG. 4B are diagrams illustrating an example of a measuring spring terminal according to the first embodiment.
Figure 4B:
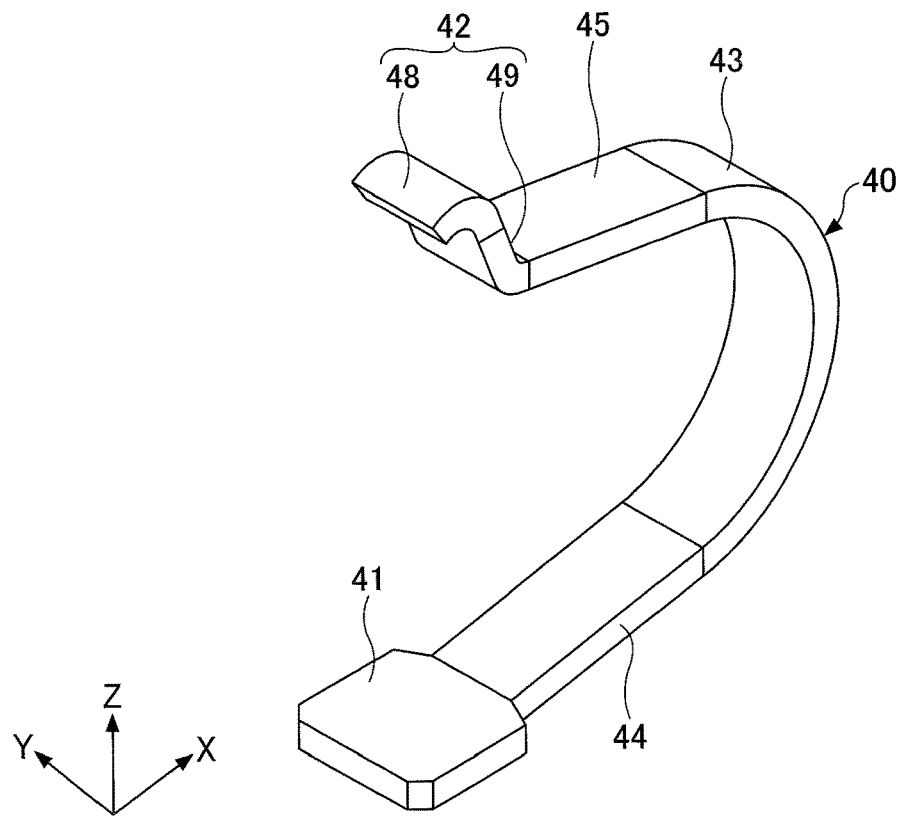

FIG. 4A and FIG. 4B are diagrams illustrating an example of the measuring spring terminal according to the first embodiment. FIG. 4A is a cross sectional view of the measuring spring terminal, and FIG. 4B is a perspective view of the measuring spring terminal.

As illustrated in FIG. 4A and FIG. 4B, the measuring spring terminal 40 is a conductive spring member including a fixing portion 41, a connecting portion 42, a spring portion 43, a first support portion 44, and a second support portion 45.

The fixing portion 41 is a plate-shaped portion formed on one end of the measuring spring terminal 40. The fixing portion 41 is mounted on the second surface 10b of the wiring board 10. The fixing portion 41 has a thickness of approximately 0.08 mm along a Z-direction, for example, a horizontal width of approximately 0.3 mm along a Y-direction, for example, and a vertical width of approximately 0.4 mm along a X-direction, for example.

The connecting portion 42 is formed on the other end of the measuring spring terminal 40, and is arranged to oppose the fixing portion 41. The connecting portion 42 is electrically connected to the fixing portion 41 via the spring portion 43, the first support portion 44, and the second support portion 45. The connecting portion 42 includes the contact portion 48, and a projecting portion 49. The connecting portion 42 has a thickness of approximately 0.08 mm, for example, and a horizontal thickness of approximately 0.2 mm along the Y-direction, for example.

The spring portion 43, the first support portion 44, and the second support portion 45 may also be referred to as a curved portion of the measuring spring terminal 40. In other words, the measuring spring terminal 40 includes the connecting portion 42 and the fixing portion 41 that are arranged to oppose each other, via the curved portion having spring properties.

The contact portion 48 makes contact with the terminal of the corresponding one of the strain gauges 551 through 558. The contact portion 48 has a round shape, and moves mainly in the Z-direction when pressed by the measuring spring terminal 40. Because the contact portion 48 has the round shape, it is possible to prevent the terminals of the strain gauges 551 through 558 from becoming damaged when the contact portion 48 is pressed by the measuring spring terminal 40 and makes contact with the terminal of the corresponding one of the strain gauges 551 through 558.

The projecting portion 49 has one end thereof integrally formed on the second support portion 45, the other end thereof integrally formed on the contact portion 48. The projecting portion 49 projects from the second support portion 45 in a direction toward the terminal of the corresponding one of the strain gauges 551 through 558, that is, in the direction separating from the fixing portion 41.

By providing, between the contact portion 48 and the second support portion 45, the projecting portion 49, that is integrally formed on the contact portion 48 and the second support portion 45, and projects from the second support portion 45 in the direction toward the terminal of the corresponding one of the strain gauges 551 through 558, it is possible to obtain the following advantageous features or effects. That is, it is possible to prevent contact between the terminal of the corresponding one of the strain gauges 551 through 558 and the second support portion 45, caused by the deformation of the spring portion 43 when the contact portion 48 is pressed, and thereby prevent damage to the measuring spring terminal 40 and the terminal of each of the strain gauges 551 through 558.

A projecting amount D of the connecting portion 42 in a state where the terminal of the corresponding one of the strain gauges 551 through 558 does not make contact with the connecting portion 52 may be 0.3 mm, for example. The projecting amount D is the amount of the connecting portion 52 that projects with reference to a joint between the second support portion 45 and the projecting portion 49.

The spring portion 43 is arranged between the first support portion 44 and the second support portion 45, and is integrally formed on the first support portion 44 and the second support portion 45. The spring portion 43 has a curved shape, such as a C-shape, for example, and has spring properties.

The spring portion 43 causes a rebound of the connecting portion 42 in the direction toward the terminal of the corresponding one of the strain gauges 551 through 558 when the connecting portion 42 is pressed. Hence, the spring portion 43 can cause the connecting portion 42 and the terminal of the corresponding one of the strain gauges 551 through 558 to contact each other, without fixing the connecting portion 42 to the terminal of the corresponding one of the strain gauges 551 through 558. For example, a thickness of the spring portion 43 and a horizontal width of the spring portion 43 along the Y-direction, may be the same as the thickness of the connecting portion 42 and the horizontal width of the connecting portion 42 along the Y-direction, respectively.

In the measuring spring terminal 40 according to the first embodiment, the first support portion 44, the spring portion 43, the second support portion 45, and the connecting portion 42 actually function integrally as a spring. A spring constant of a part of the measuring spring terminal 40 corresponding to the first support portion 44, the spring portion 43, the second support portion 45, and the connecting portion 42 may be 0.6 N/mm to 0.8 N/mm, for example.

The first support portion 44 is arranged between the spring portion 43 and the fixing portion 41. One end of the first support portion 44 is integrally formed on one end of the spring portion 43, and the other end of the first support portion 44 is integrally formed on the fixing portion 41. The first support portion 44 is plate-shaped.

The first support portion 44 is formed so that an angle θ between a plane E that includes a lower surface of the fixing portion 41 and a surface 44a of the first support portion 44 on the side opposing the wiring board 10, is an acute angle. The angle θ may be 5 degrees to 15 degrees, for example.

By setting the angle θ to the acute angle, it is possible to prevent contact between the wiring board 10 and the first support portion 44 caused by the deformation of the spring portion 43 when the contact portion 48 is pressed, and thereby prevent damage to the measuring spring terminal 40 and the wiring board 10. For example, a thickness of the first support portion 44 and a horizontal width of the first support portion 44 along the Y-direction, may be the same as the thickness of the connecting portion 42 and the horizontal width of the connecting portion 42 along the Y-direction, respectively.

The second support portion 45 is arranged between the spring portion 43 and the connecting portion 42. One end of the second support portion 45 is integrally formed on the other end of the spring portion 43, and the other end of the second support portion 45 is integrally formed on the projecting portion 49 of the connecting portion 42. The second support portion 45 is plate-shaped. For example, a thickness of the second support portion 45 and a horizontal width of the second support portion 45 along the Y-direction, may be the same as the thickness of the connecting portion 42 and the horizontal width of the connecting portion 42 along the Y-direction, respectively.

In the state illustrated in FIG. 4A where the connecting portion 42 of the measuring spring terminal 40 is not pressed, a height H of the measuring spring terminal 40 is approximately 1 mm to approximately 2 mm, for example.

The measuring spring terminal 40 may be made by preparing a Cu alloy, such as phosphor bronze, beryllium copper, Corson copper alloy, or the like, and performing a punching process or a bending process on the Cu alloy. A Ni-plated film or a Au-plated film may be formed on a part of the measuring spring terminal 40, or on the entire measuring spring terminal 40.

The dummy spring terminal 50 may be formed similarly to the measuring spring terminal 40, to the same shape as the measuring spring terminal 40.

[Mounting Semiconductor Device on Measurement Target]

Figure 5:
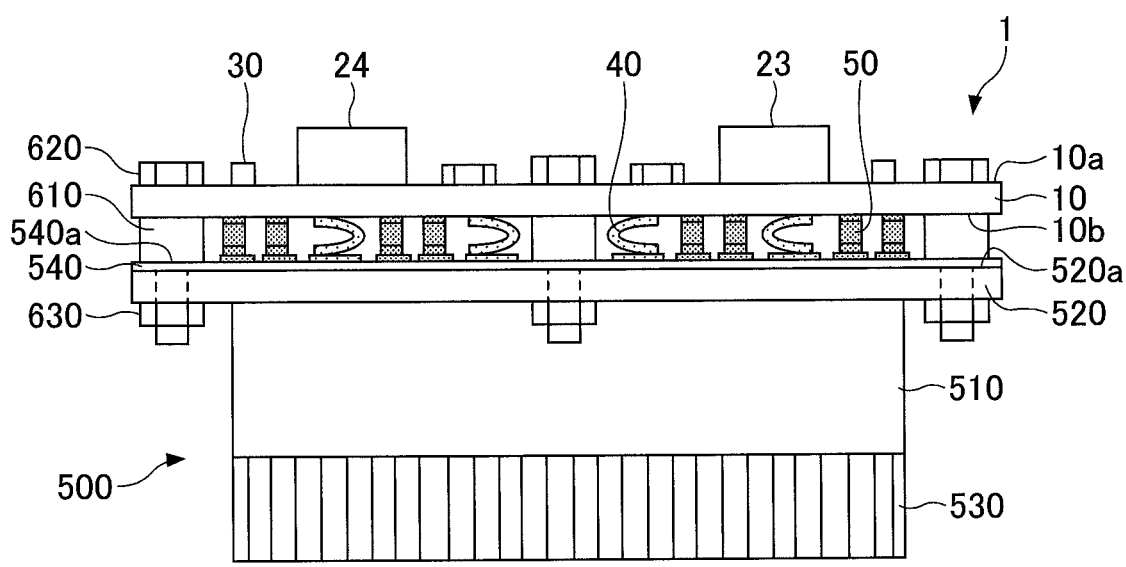
FIG. 5 is a side view illustrating an example of a state where the semiconductor device according to the first embodiment is mounted on the measurement target.

FIG. 5 is a side view illustrating an example of a state where the semiconductor device according to the first embodiment is mounted on the measurement target.

The semiconductor device 1 illustrated in FIG. 5 may be detachably mounted on the measurement target 500 having a plurality of sensors (for example, the strain gauges 551 through 558) provided on the predetermined surface 520a.

More particularly, the through hole 10y in the wiring board 10 of the semiconductor device 1, and the through hole 500y in the disk section 520 of the measurement target 500, are positionally aligned, and the semiconductor device 1 is mounted on the measurement target 500 with 4 squeezing amount adjusting spacers 610 interposed between the opposing surfaces of the wiring board 10 and the disk section 520. The squeezing amount adjusting spacers 610 may be used to adjust the amount of the measuring spring terminals 40 and the dummy spring terminals 50, squeezed between the opposing surfaces of the wiring board 10 and the disk section 520.

The squeezing amount adjusting spacer 610 includes a through hole that is not illustrated. A bolt 620 is inserted into the through hole 10y in the wiring board 10, the through hole in the squeezing amount adjusting spacer 610, and the through hole 500y in the disk section 520, and screwed into a nut 630 at the lower surface of the disk section 520. The squeezing amount adjusting spacer 610 may be made of stainless steel, aluminum, iron, brass, or the like, for example. A height of the squeezing amount adjusting spacer 610 is approximately 0.85 mm to approximately 1.7 mm, for example.

As illustrated in FIG. 5, the semiconductor device 1 is mounted on the measurement target 500 so that the predetermined surface 520a of the measurement target 500 opposes the second surface 10b of the wiring board 10. In the state illustrated in FIG. 5, the measurement spring terminals 40 make contact with the terminals of the corresponding strain gauges 551 through 558, to electrically connect to the terminals of the corresponding strain gauges 551 through 558, respectively. In addition, the dummy spring terminals 50 make contact with the dummy terminals 570 of the measurement target 500, respectively.

Figure 6:
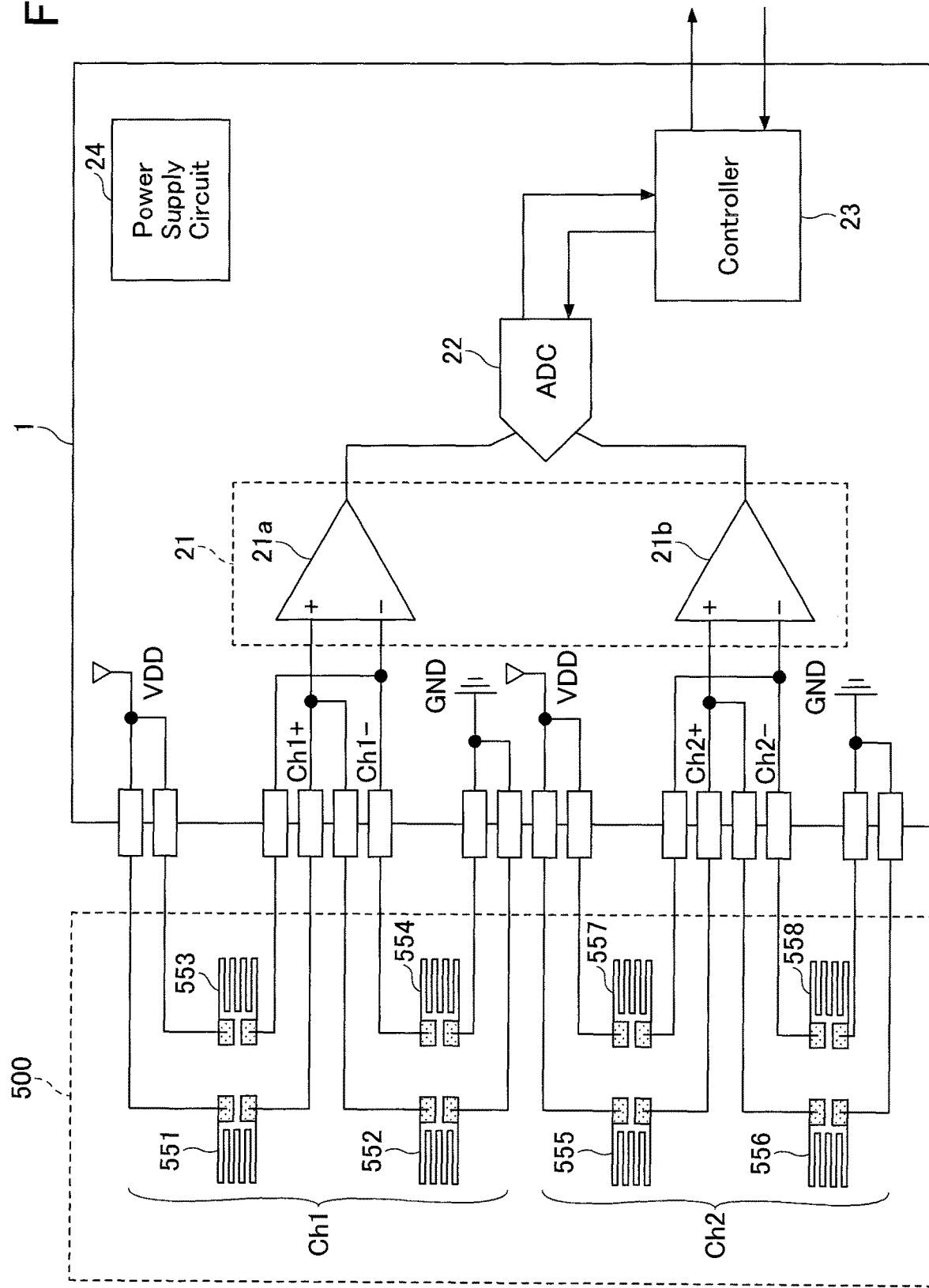
FIG. 6 is a block diagram illustrating an example of a strain detection circuit of the semiconductor device according to the first embodiment.

FIG. 6 is a block diagram illustrating an example of a strain detection circuit of the semiconductor device according to the first embodiment. As illustrated in FIG. 6, one of the pair of terminals of the strain gauge 551 is connected to a power supply voltage VDD, and the other of the pair of terminals of the strain gauge 551 is connected to a positive input terminal of an operational amplifier 21a included in the semiconductor integrated circuit 21. One of the pair of terminals of the strain gauge 552 is connected to the positive input terminal of the operational amplifier 21a, and the other of the pair of terminals of the strain gauge 551. The other of the pair of terminals of the strain gauge 552 is connected to a ground GND.

One of the pair of terminals of the strain gauge 553 is connected to the power supply voltage VDD, and the other of the pair of terminals of the strain gauge 553 is connected to a negative input terminal of the operational amplifier 21a. One of the pair of terminals of the strain gauge 554 is connected to the negative input terminal of the operational amplifier 21a, and the other of the pair of terminals of the strain gauge 553. The other of the pair of terminals of the strain gauge 554 is connected to the ground GND.

One of the pair of terminals of the strain gauge 555 is connected to the power supply voltage VDD, and the other of the pair of terminals of the strain gauge 555 is connected to a positive input terminal of an operational amplifier 21b included in the semiconductor integrated circuit 21. One of the pair of terminals of the strain gauge 556 is connected to the positive input terminal of the operational amplifier 21b, and the other of the pair of terminals of the strain gauge 555. The other of the pair of terminals of the strain gauge 556 is connected to the ground GND.

One of the pair of terminals of the strain gauge 557 is connected to the power supply voltage VDD, and the other of the pair of terminals of the strain gauge 557 is connected to a negative input terminal of the operational amplifier 21b. One of the pair of terminals of the strain gauge 558 is connected to the negative input terminal of the operational amplifier 21b, and the other of the pair of terminals of the strain gauge 557. The other of the pair of terminals of the strain gauge 558 is connected to the ground GND.

An analog output of the operational amplifier 21a, indicating a strain detection value for 1 channel, is converted into a digital signal by the semiconductor integrated circuit 22 that forms an analog-to-digital converter (ADC), and input to a semiconductor integrated circuit 23 that forms a controller. In addition, an analog output of the operational amplifier 21b, indicating a strain detection value for the other channel, is converted into a digital signal by the semiconductor integrated circuit 22 that forms the ADC, and input to the semiconductor integrated circuit 23 that forms the controller.

The semiconductor integrated circuit 23 that forms the controller may, in response to a request from a host apparatus, transmit strain voltage data or other computation results to the host apparatus. In addition, the semiconductor integrated circuit 23 that forms the controller may control the semiconductor integrated circuit 22 that forms the ADC, and receive the digital signal from the semiconductor integrated circuit 22 that forms the ADC that converts the strain voltage data. The semiconductor integrated circuit 23 that forms the controller may compute a torque, a pressure, or the like from the received strain voltage data, if appropriate. The semiconductor integrated circuit 23 that forms the controller, may be formed by a micro control unit (MCU), a field programmable gate array (FPGA), or the like, for example.

The required power may be supplied to the semiconductor integrated circuits 21 through 23 from the semiconductor integrated circuit 24 that forms a power supply circuit.

The strain gauges 551 through 558 formed on the measurement target 500 form a 1-channel Wheatstone bridge circuit, corresponding to a channel Ch1 illustrated in FIG. 6, by being connected to the semiconductor device 1. In addition, the strain gauges 551 through 558 formed on the measurement target 500 form another 1-channel Wheatstone bridge circuit, corresponding to a channel Ch2 illustrated in FIG. 6, by being connected to the semiconductor device 1.

The semiconductor device 1 can improve the detection accuracy of the mechanical strain generated in the disk section 520, by forming the Wheatstone bridge circuits of a plurality of channels when the semiconductor device 1 is connected to the measurement target 500 that is formed with the strain gauges 551 through 558. However, the Wheatstone bridge circuit of only 1 channel may be formed, since the mechanical strain generated in the disk section 520 is detectable by the Wheatstone bridge circuit of at least 1 channel.

The detection voltage output from each of the strain gauges 551 through 558 has an extremely small value of approximately 0.1 mV/V to approximately 2.0 mV/V. For this reason, when the electrical connection between the semiconductor device and the strain gauges is made according to the conventional method via connection components, such as lead wires, connectors, or the like, for example, a wiring resistance of the lead wire up to an input section of the semiconductor device, and a contact resistance of the connection component such as the connector or the like that connects to the semiconductor device, become no longer negligible. In other words, the detection voltage output from each strain gauge would decrease due to the wiring resistance of the lead wire, and the contact resistance of the connection component, such as the connector or the like, thereby making it difficult to accurately obtain the detection voltage output from each strain gauge.

According to the semiconductor device 1, however, each measuring spring terminal 40 makes direct contact with the terminal of the corresponding one of the strain gauges 551 through 558, to electrically connect each measuring spring terminal 40 and the terminal of the corresponding one of the strain gauges 551 through 558. Hence, each measuring spring terminal 40 and the terminal of the corresponding one of the strain gauges 551 through 558 are connectable by a shortest distance. For this reason, the semiconductor device 1 can reduce the decrease in the detection voltage output from each of the strain gauges 551 through 558, thereby making it possible to accurately obtain the detection voltage output from each of the strain gauges 551 through 558.

In addition, unlike the conventional method of electrically connecting the semiconductor device and the strain gauges, the semiconductor device 1 does not require lead wires to be connected to the terminals of the strain gauges using soldering, bonding, or the like, and does not require connection components, such as connectors or the like, to connect the lead wires to the wiring board. For this reason, the semiconductor device 1 enables easy routing among the components, thereby making it possible to easily assemble the components, and easily mount the semiconductor device 1 on a small measurement target. Further, when the semiconductor device 1 fails, it is possible to easily analyze the cause of the failure, and easily replace the components, if appropriate.

Because the semiconductor device 1 includes the dummy spring terminals 50, it is possible to even more accurately obtain the detection voltage from each of the strain gauges 551 through 558, as opposed to a comparison example described hereinafter with reference to FIG. 7.

Figure 7:
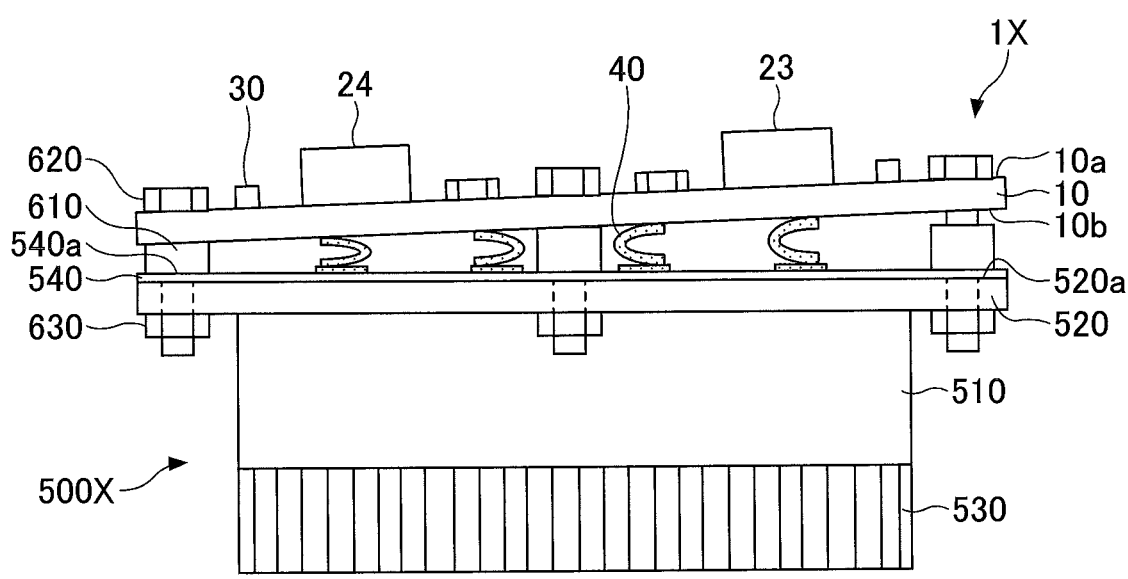
FIG. 7 is a side view illustrating an example of a state where a semiconductor device according to a comparison example is mounted on the measurement target.

FIG. 7 is a side view illustrating an example of a state where a semiconductor device according to the comparison example is mounted on the measurement target. As illustrated in FIG. 7, a semiconductor device 1X according to the comparison example differs from the semiconductor device 1 according to the first embodiment, in that the semiconductor device 1X includes no dummy spring terminals 50. In FIG. 7, an inclination of the wiring board 10 is illustrated in an exaggerated manner.

Because the semiconductor device 1X includes no dummy spring terminals 50, the wiring board 10 is supported solely by the 16 measuring spring terminals 40 when the semiconductor device 1X is mounted on the measurement target 500, as illustrated in FIG. 7. Because the number of measuring spring terminals 40 supporting the wiring board 10 is limited, that is, 16 and small, the wiring board 10 becomes unstable, and it is difficult to maintain the wiring board 10 parallel to the predetermined surface 520a of the disk section 520. Consequently, the load is not uniformly applied to each of the measuring spring terminals 40. As a result, the contact resistance between each of the measuring spring terminals 40 and the terminal of the corresponding one of the strain gauges 551 through 558 becomes inconsistent in this comparison example, and the strain cannot be detected accurately.

On the contrary, the semiconductor device 1 according to the first embodiment includes 40 dummy spring terminals 50, and when the semiconductor device 1 is mounted on the measurement target 500, as illustrated in FIG. 5, the wiring board 10 is supported by the 16 measuring spring terminals 40 and the 40 dummy spring terminals 50. For this reason, the wiring board 10 can be maintained parallel to the predetermined surface 520a of the disk section with ease, and a uniform load is applied to each of the measuring spring terminals 40. As a result, the inconsistency in the contact resistance between each of the measuring spring terminals 40 and the terminal of the corresponding one of the strain gauges 551 through 558 can be reduced, to thereby make it possible to accurately detect the strain.

In the semiconductor device 1, the plurality of dummy spring terminals 50 preferably include dummy spring terminals 50 arranged on the inner peripheral side of the wiring board 10 (that is, closer to the through hole 10x) than the measuring spring terminals 40, and dummy spring terminals 50 arranged on the outer peripheral side of the wiring board 10 than the measuring spring terminals 40. In addition, the plurality of dummy spring terminals 50 are preferably arranged at positions point symmetrical with respect to the center of the wiring board 10. By positioning the plurality of dummy spring terminals 50 in such an arrangement, it becomes possible to easily maintain the wiring board 10 parallel to the predetermined surface 520a of the disk section 520.

It is possible to easily maintain the wiring board 10 parallel to the predetermined surface 520a of the disk section 520, when the dummy spring terminals 50 are formed to the same shape as the measuring spring terminals 40, and the thickness of the dummy spring terminals 50 are made the same as the thickness of the terminals of the strain gauges 551 through 558.

However, the hardness of the dummy spring terminals 50 does not necessarily have to be the same as the hardness of the measuring spring terminals 40, and the dummy spring terminals 50 may be harder than the measuring spring terminals 40 by suitably adjusting the material or the like used for the dummy spring terminals 50. It becomes easier to maintain the wiring board 10 parallel to the predetermined surface 520a of the disk section 520, when the dummy spring terminals 50 are harder than the measuring spring terminals 40. This is because, when the spring having a large spring constant and harder than the measuring spring terminals 40 is used for the dummy spring terminals 50, the rigidity of the spring increases relatively, thereby making it possible for the spring to function as a column or pillar.

However, the measuring spring terminals 40 and the dummy spring terminals 50 are required to be softer than the squeezing amount adjusting spacers 610. The reference for the terms hard and soft is the spring constant in the case of the spring terminals 40 and 50, and is the Young's modulus in the case of the squeezing amount adjusting spacers 610. The spring constant and the Young's modulus may be related according to the following formula, where k denotes the spring constant, E denotes the Young's modulus, A denotes a cross sectional area of a member (spring terminal or spacer), and L denotes a length of the member (spring terminal or spacer). Hence, the hardnesses of the measuring spring terminals 40, the dummy spring terminals 50, and the squeezing amount adjusting spacers 610 can be compared using the following formula.

$$k = E \times A/L$$

Second Embodiment

In an example of the semiconductor device according to a second embodiment, the projections have a shape different from the shape of the projections in the semiconductor device 1 according to the first embodiment. In the second embodiment, those parts that are the same as the corresponding parts of the first embodiment are designated by the same reference numerals, and a repeated description of the same parts may be omitted.

Figure 8:
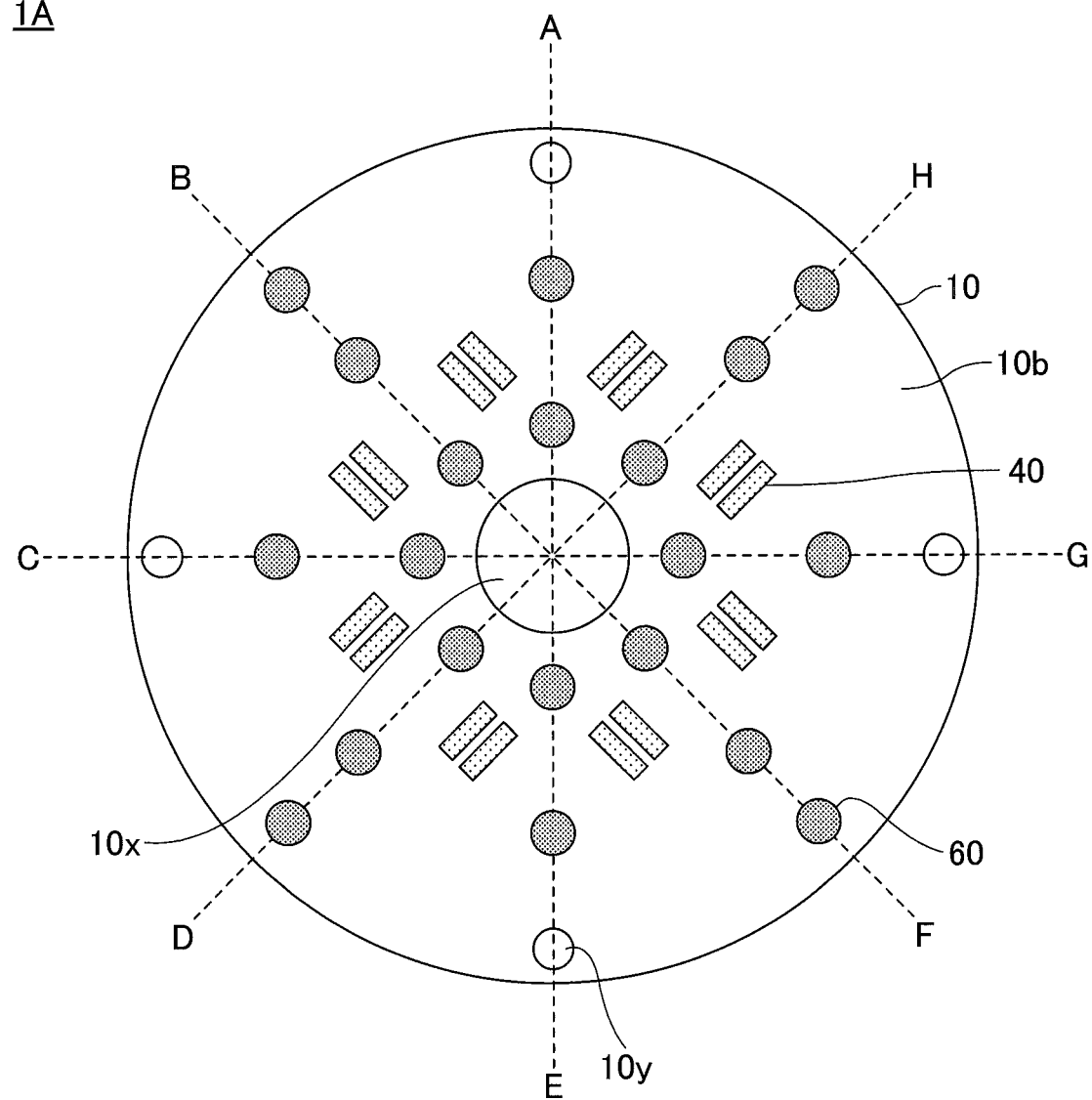
FIG. 8 is a rear view illustrating an example of the semiconductor device according to a second embodiment.
Figure 9:
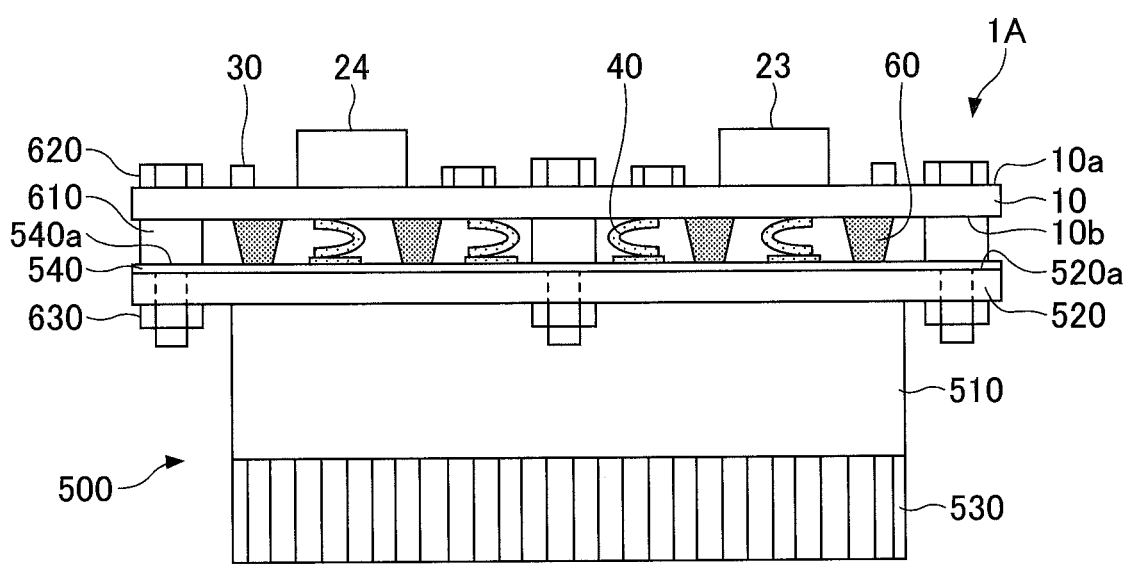
FIG. 9 is a side view illustrating an example of a state where the semiconductor device according to the second embodiment is mounted on the measurement target.

FIG. 8 is a rear view illustrating the example of the semiconductor device according to the second embodiment. FIG. 9 is a side view illustrating an example of a state where the semiconductor device according to the second embodiment is mounted on the measurement target. As illustrated in FIG. 8 and FIG. 9, a semiconductor device 1A differs from the semiconductor device 1 illustrated in FIG. 3, in that the dummy spring terminals 50 forming the projections of the semiconductor device 1 are replaced by columnar members 60 made of a rubber in the semiconductor device 1A.

The columnar members 60 may be formed by butyl rubber, for example. The columnar members 60 may have a truncated cone shape, for example. In this example, an upper surface of the truncated cone shape of the columnar members 60, having an area larger than a lower surface of the truncated cone shape of the columnar members 60, is fixed to the second surface 10b of the wiring board 10, using an adhesive or the like. When the semiconductor device 1A is mounted on the measurement target 500, the lower surface of the truncated cone shape of the columnar members 60, having the area smaller than the area of the upper surface of the truncated cone shape of the columnar members 60, makes contact with the measurement target 500.

Only the strain gauges 551 through 558 corresponding to the 2 channels are formed on the one surface 540a of the substrate 540, and there is no need to form the dummy terminals 570 on the one surface 540a of the substrate 540. When the substrate 540, including only the strain gauges 551 through 558 and not the dummy terminals 570, is arranged approximately on the entire predetermined surface 520a of the measurement target disk section 520, each of the columnar members 60 makes contact with the one surface 540a of the substrate 540. In addition, when the substrate 540, including only the strain gauges 551 through 558 and not the dummy terminals 570, is arranged only within a minimum required range on the predetermined surface 520a of the measurement target disk section 520, each of the columnar members 60 makes direct contact with the predetermined surface 520a of the measurement target disk section 520. Of course, the columnar members 60 that make contact with the one surface 540a of the substrate 540, and the columnar members 60 that make direct contact with the predetermined surface 520a of the measurement target disk section 520, may coexist.

Accordingly, the projections are not limited to the dummy spring terminals 50, and the rubber columnar members 60 may be used as the projections. In this case, in addition to the advantageous features or effects obtainable by the first embodiment, an advantageous feature or effect of simplifying interconnect patterns of the substrate 540 is obtainable because it is unnecessary to form the dummy terminals 570. In addition, when the rubber columnar members 60 are used, it is possible to easily adjust the shape of the columnar members 60, and there is no possibility of generating a short-circuit among the columnar members 60.

Third Embodiment

In an example of the semiconductor device according to a third embodiment, the projections have a shape different from the shape of the projections in the semiconductor device 1 according to the first embodiment. In the third embodiment, those parts that are the same as the corresponding parts of the first and second embodiments are designated by the same reference numerals, and a repeated description of the same parts may be omitted.

Figure 10:
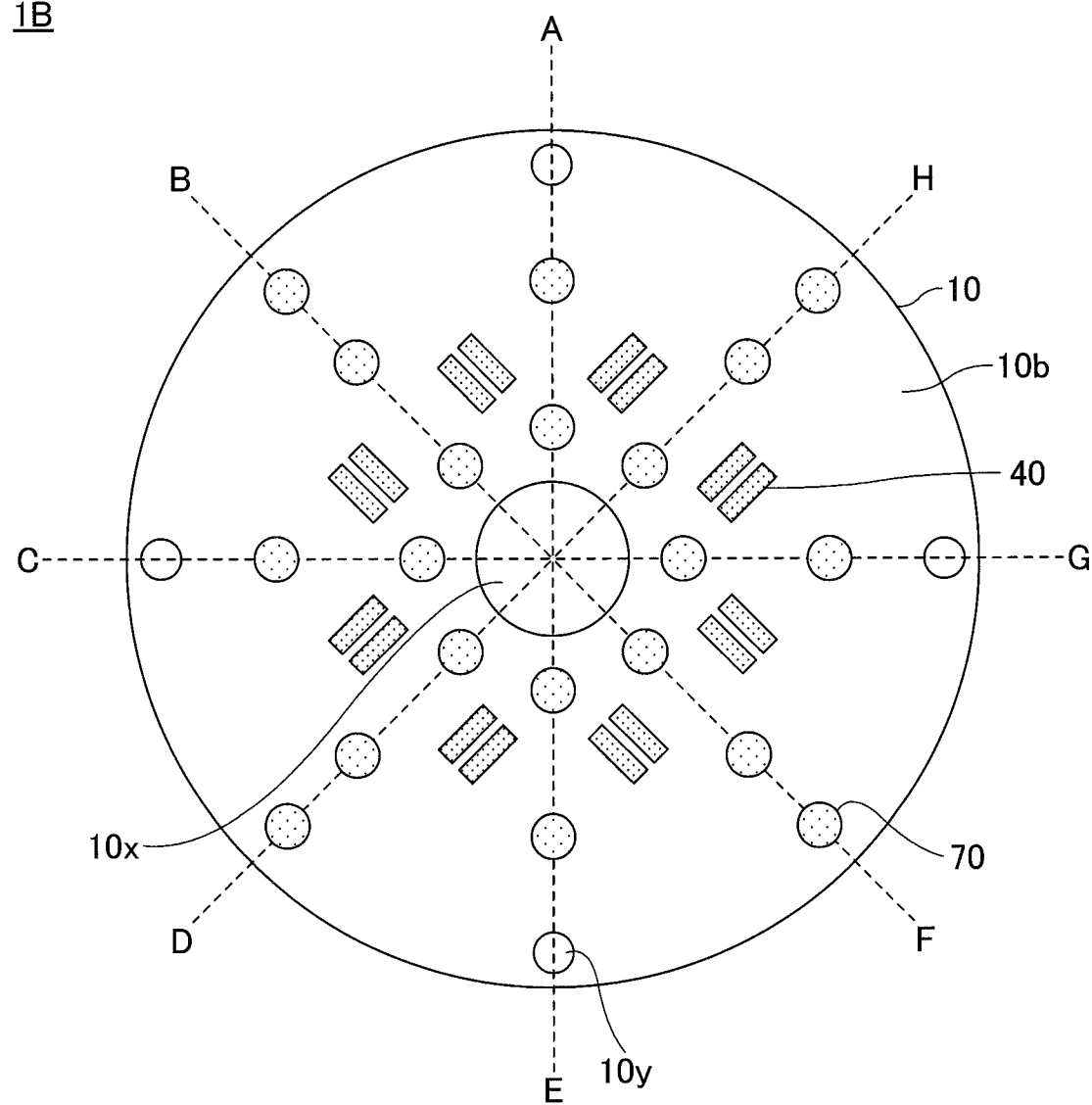
FIG. 10 is a rear view illustrating an example of the semiconductor device according to a third embodiment.
Figure 11:
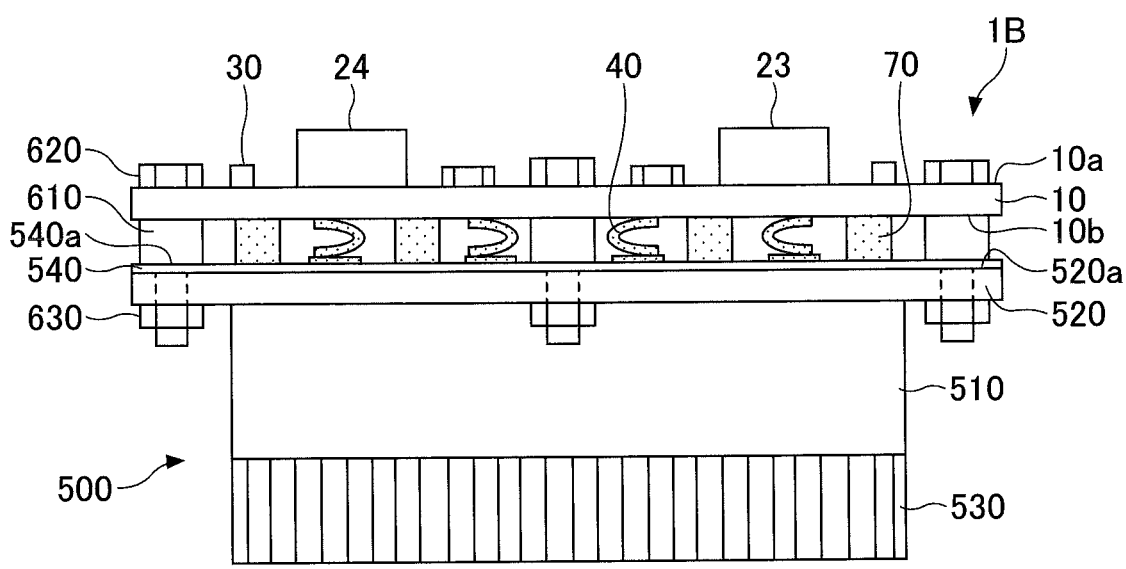
FIG. 11 is a side view illustrating an example of a state where the semiconductor device according to the third embodiment is mounted on the measurement target.

FIG. 10 is a rear view illustrating the example of the semiconductor device according to the third embodiment. FIG. 11 is a side view illustrating an example of a state where the semiconductor device according to the third embodiment is mounted on the measurement target. As illustrated in FIG. 10 and FIG. 11, a semiconductor device 1B differs from the semiconductor device 1 illustrated in FIG. 3, in that the dummy spring terminals 50 forming the projections of the semiconductor device 1 are replaced by columnar members 70 made of a metal in the semiconductor device 1B.

The columnar members 70 may be formed by copper, for example. The columnar members 70 may have a cylindrical shape, for example. In this example, an upper end surface of the cylindrical shape of the columnar members 70 is fixed to a land formed on the second surface 10b of the wiring board 10, using an adhesive or the like. When the semiconductor device 1B is mounted on the measurement target 500, a lower end surface of the cylindrical shape of the columnar members 70 makes contact with the measurement target 500.

Only the strain gauges 551 through 558 corresponding to the 2 channels are formed on the one surface 540a of the substrate 540, and there is no need to form the dummy terminals 570 on the one surface 540a of the substrate 540. When the substrate 540, including only the strain gauges 551 through 558 and not the dummy terminals 570, is arranged approximately on the entire predetermined surface 520a of the measurement target disk section 520, each of the columnar members 70 makes contact with the one surface 540a of the substrate 540. In addition, when the substrate 540, including only the strain gauges 551 through 558 and not the dummy terminals 570, is arranged only within the minimum required range on the predetermined surface 520a of the measurement target disk section 520, each of the columnar members 70 makes direct contact with the predetermined surface 520a of the measurement target disk section 520. Of course, the columnar members 70 that make contact with the one surface 540a of the substrate 540, and the columnar members 70 that make direct contact with the predetermined surface 520a of the measurement target disk section 520, may coexist.

Accordingly, the projections are not limited to the dummy spring terminals 50, and the metal columnar members 70 may be used as the projections. In this case, in addition to the advantageous features or effects obtainable by the first embodiment, an advantageous feature or effect of simplifying the interconnect patterns of the substrate 540 is obtainable because it is unnecessary to form the dummy terminals 570. In addition, when the metal columnar members 70 are used, it is possible to easily maintain the wiring board 10 parallel to the predetermined surface 520a of the disk section 520, because the spring constant (or Young's modulus) of the metal columnar members 70 is large, thereby making the metal columnar members 70 hard, and increasing the rigidity of the metal columnar members 70 relatively.

Fourth Embodiment

In an example of the semiconductor device according to a fourth embodiment, the number of dummy spring terminals 50 is increased compared to that of the semiconductor device 1 according to the first embodiment. In the fourth embodiment, those parts that are the same as the corresponding parts of the first through third embodiments are designated by the same reference numerals, and a repeated description of the same parts may be omitted.

Figure 12:
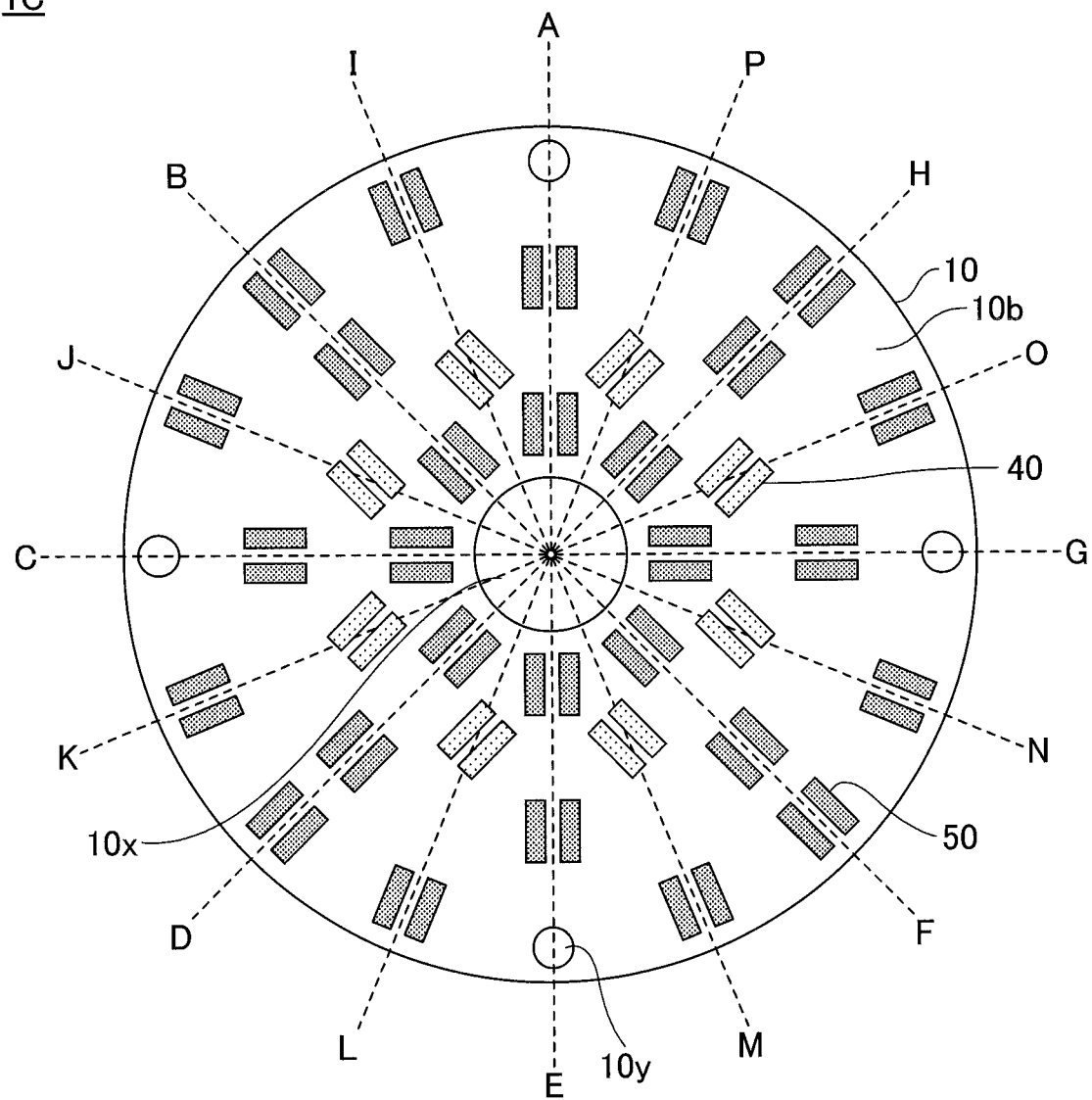
FIG. 12 is a rear view illustrating an example of the semiconductor device according to a fourth embodiment.

FIG. 12 is a rear view illustrating the example of the semiconductor device according to the fourth embodiment. As illustrated in FIG. 12, a semiconductor device 1c differs from the semiconductor device 1 illustrated in FIG. 3, in that 16 dummy spring terminals 50 are added at the outermost periphery of the wiring board 10.

In FIG. 12, 4 straight lines IM, JN, KO, and LP are added, in addition to the 4 straight lines AE, BF, CG, and DH illustrated in FIG. 3, as the virtual lines. In the plan view, 2 mutually adjacent virtual lines form an angle of 22.5 degrees.

In the example illustrated in FIG. 12, 2 pairs of dummy spring terminals 50 are arranged spaced apart from each other along the straight line IM, where the 2 dummy spring terminals 50 of each of the 2 pairs of dummy spring terminals 50 oppose each other via the straight line IM. In addition, 2 pairs of dummy spring terminals 50 are arranged spaced apart from each other along the straight line JN, where the 2 dummy spring terminals 50 of each of the 2 pairs of dummy spring terminals 50 oppose each other via the straight line JN. Moreover, 2 pairs of dummy spring terminals 50 are arranged spaced apart from each other along the straight line KO, where the 2 dummy spring terminals 50 of each of the 2 pairs of dummy spring terminals 50 oppose each other via the straight line KO. Further, 2 pairs of dummy spring terminals 50 are arranged spaced apart from each other along the straight line LP, where the 2 dummy spring terminals 50 of each of the 2 pairs of dummy spring terminals 50 oppose each other via the straight line LP.

The plurality of dummy spring terminals 50 are arranged at positions point symmetrical with respect to the center of the through hole 10x, so as to form 3 concentric circles with respect to the center of the through hole 10x. In this embodiment, the 16 dummy spring terminals 50 that are additionally provided are all arranged on the concentric circles located at the outermost periphery of the wiring board 10. Hence, the number of dummy spring terminals 50 arranged on the concentric circles located at the outermost periphery of the wiring board 10, which is 24, is greater than the number of dummy spring terminals 50 arranged on the concentric circles located on the inner side of the outermost periphery of the wiring board 10, which is 16.

By making the number of dummy spring terminals 50 arranged at positions distant from the center of the through hole 10x, greater than the number of dummy spring terminals 50 arranged at positions close to the center of the through hole 10x, it becomes possible to uniformly distribute the dummy spring terminals 50 on the second surface 10b of the wiring board 10. As a result, the ease of maintaining the wiring board 10 parallel to the predetermined surface 520a of the disk section 520 can further be improved.

Accordingly to each of the embodiments described above, it is possible to provide a semiconductor device, that is mounted on a measurement target provided with a sensor, and capable of accurately obtaining a detection voltage from the sensor.

Although the embodiments are numbered with, for example, "first," "second," "third," or "fourth," the ordinal numbers do not imply priorities of the embodiments. Many other variations and modifications will be apparent to those skilled in the art.

For example, in each of the above embodiments, the strain gauge is described as an example of a sensor. However, the sensor is not limited to the strain gauge, as long as it is possible to implement a structure in which the measuring spring terminals provided on the semiconductor device can detachably make contact with the terminals that electrically connect to the sensors. Other examples of the sensor include a temperature gauge or the like, for example. Further, the disclosed semiconductor device may also be implemented in light quantity measurements or the like using photodiodes, for example.

In addition, in each of the above embodiments, the plurality of dummy spring terminals and the columnar members are arranged at the positions point symmetrical with respect to the center of the wiring board in the described examples. However, the positions of the plurality of dummy spring terminals and the columnar members are not limited to those of the described examples. For example, in a case where the positions to be preferably supported, in order to maintain the wiring board parallel to the measurement target, are known in advance, the dummy spring terminals and the columnar members may be arranged at such positions to be preferably supported, regardless of whether such positions are point symmetrical with respect to the center of the wiring board.

Further, although the wiring board has the disk shape in each of the above embodiments, the shape of the wiring board is not limited to the disk shape. For example, the planar shape of the wiring board may be an oval shape, a rectangular shape, a more complicated shape, or the like.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device, detachably mountable on a measurement target that includes a cylinder section, a disk section, a plurality of sensors and a plurality of sensor terminals fixed to a predetermined surface thereof, respectively, the semiconductor device comprising: a wiring board having a first surface, and a second surface opposite to the first surface; a semiconductor integrated circuit, mounted on the first surface of the wiring board, and configured to perform a computation based on signals received from the plurality of sensors;
   a plurality of measuring spring terminals mounted on the second surface of the wiring board at positions point symmetrical with respect to a center of the wiring board; and
   a plurality of projections provided on the second surface of the wiring board, wherein the positions of the plurality of measuring spring terminals on the second surface of the wiring board are located on an imaginary circle having a center coinciding with the center of the wiring board, in a state where the semiconductor device is mounted on the measurement target so that the predetermined surface of the measurement target opposes the second surface of the wiring board, each of the plurality of measuring spring terminals makes contact with a corresponding one of the plurality of sensor terminals electrically connected to a corresponding one of the plurality of sensors, so as to electrically connect to the corresponding one of the plurality of sensors, each of the plurality of projections makes contact with the measurement target, and the semiconductor integrated circuit performs the computation based on the signals received from the plurality of sensors via the plurality of sensor terminals and the plurality of measuring spring terminals.

2. The semiconductor device as claimed in claim 1, wherein the plurality of projections are formed by a plurality of dummy spring terminals, and each of the plurality of dummy spring terminals makes contact with the measurement target in the state where the semiconductor device is mounted on the measurement target.

3. The semiconductor device as claimed in claim 2, wherein each of the plurality of dummy spring terminals makes contact with a corresponding one of a plurality of dummy terminals provided on the measurement target, in the state where the semiconductor device is mounted on the measurement target, the plurality of dummy spring terminals and the plurality of measuring spring terminals have identical shapes, and the plurality of dummy terminals and the plurality of sensor terminals have identical thicknesses.

4. The semiconductor device as claimed in claim 1, wherein the plurality of projections are formed by a plurality of columnar members, respectively.

5. The semiconductor device as claimed in claim 1, wherein the plurality of projections include a projection arranged nearer to the center of the wiring board than to the plurality of measuring spring terminals, and a projection arranged nearer to an outer peripheral side of the wiring board than to the plurality of measuring spring terminals.

6. The semiconductor device as claimed in claim 2, wherein the plurality of projections include a projection arranged nearer to the center of the wiring board than to the plurality of measuring spring terminals, and a projection arranged nearer to an outer peripheral side of the wiring board than to the plurality of measuring spring terminals.

7. The semiconductor device as claimed in claim 4, wherein the plurality of projections include a projection arranged nearer to the center of the wiring board than to the plurality of measuring spring terminals, and a projection arranged nearer to an outer peripheral side of the wiring board than to the plurality of measuring spring terminals.

8. The semiconductor device as claimed in claim 1, wherein the plurality of projections are arranged at positions point symmetrical with respect to the center of the wiring board, and the positions of the plurality of projections on the second surface of the wiring board are located on imaginary concentric circles having a center coinciding with the center of the wiring board.

9. The semiconductor device as claimed in claim 2, wherein the plurality of projections are arranged at positions point symmetrical with respect to the center of the wiring board, and the positions of the plurality of projections on the second surface of the wiring board are located on imaginary concentric circles having a center coinciding with the center of the wiring board.

10. The semiconductor device as claimed in claim 4, wherein the plurality of projections are arranged at positions point symmetrical with respect to the center of the wiring board, and the positions of the plurality of projections on the second surface of the wiring board are located on imaginary concentric circles having a center coinciding with the center of the wiring board.

11. The semiconductor device as claimed in claim 5, wherein the plurality of projections are arranged at positions point symmetrical with respect to the center of the wiring board, and the positions of the plurality of projections on the second surface of the wiring board are located on imaginary concentric circles having a center coinciding with the center of the wiring board.

12. The semiconductor device as claimed in claim 1, wherein the plurality of projections are harder than the plurality of measuring spring terminals.

13. The semiconductor device as claimed in claim 2, wherein the plurality of projections are harder than the plurality of measuring spring terminals.

14. The semiconductor device as claimed in claim 4, wherein the plurality of projections are harder than the plurality of measuring spring terminals.

15. The semiconductor device as claimed in claim 5, wherein the plurality of projections are harder than the plurality of measuring spring terminals.

16. The semiconductor device as claimed in claim 12, which is mounted on the measurement target via a plurality of spacers, wherein the plurality of projections are softer than the plurality of spacers.

17. The semiconductor device as claimed in claim 1, wherein the plurality of sensors are strain gauges, and the semiconductor integrated circuit computes a physical quantity selected from a group consisting of strain, pressure, displacement, acceleration, and torque, based on signals received from the strain gauges.

18. The semiconductor device as claimed in claim 2, wherein the plurality of sensors are strain gauges, and the semiconductor integrated circuit computes a physical quantity selected from a group consisting of strain, pressure, displacement, acceleration, and torque, based on signals received from the strain gauges.

19. The semiconductor device as claimed in claim 4, wherein the plurality of sensors are strain gauges, and the semiconductor integrated circuit computes a physical quantity selected from a group consisting of strain, pressure, displacement, acceleration, and torque, based on signals received from the strain gauges.

20. The semiconductor device as claimed in claim 17, wherein the plurality of sensors include at least 4 strain gauges, and the 4 strain gauges form a Wheatstone bridge circuit in the state where the semiconductor device is mounted on the measurement target.

* * * * *